US005323296A

United States Patent [19]

Gasser et al.

[11] Patent Number: 5,323,296

[45] Date of Patent: Jun. 21, 1994

[54] I/O DEVICE INCLUDING CIRCUIT BOARD NON-RIGIDLY SUPPORTED BY ELASTICALLY DEFORMABLE TERMINAL PINS EXTENDING FROM A CONNECTOR STRIP

[75] Inventors: Markus Gasser, Unterehrendingen; Markus Hänsli, Däniken; Stefan Schneeberger, Steffisburg, all of Switzerland

[73] Assignee: Asea Brown Boveri Ltd., Switzerland

[21] Appl. No.: 781,402

[22] Filed: Oct. 23, 1991

[30] Foreign Application Priority Data

Oct. 24, 1990 [CH] Switzerland ........................ 3399/90

[51] Int. Cl.[5] ........................ H05K 7/02; H01R 23/68

[52] U.S. Cl. ...................................... 361/736; 439/62; 439/76; 439/79; 361/785; 361/796

[58] Field of Search ............................ 439/76, 79, 80; 361/392-395, 399, 728-731, 736, 752, 785, 796

[56] References Cited

U.S. PATENT DOCUMENTS 3,660,728 5/1972 Carter .............................. 439/76 X
4,531,176 7/1985 Beecher, II ...................... 439/76 X
4,723,196 2/1988 Hofmeister et al. .............. 439/76 X
5,043,847 8/1991 Deinhardt et al. .................. 361/395
5,105,339 4/1992 Olsson et al. ...................... 361/399

FOREIGN PATENT DOCUMENTS 0165434 12/1985 European Pat. Off. .
3728456 3/1989 Fed. Rep. of Germany ........ 439/76
4037603 5/1991 Fed. Rep. of Germany ........ 439/76

*Primary Examiner*—Leo P. Picard
*Assistant Examiner*—Michael W. Phillips
*Attorney, Agent, or Firm*—Ostrolenk, Faber, Gerb & Soffen

[57] ABSTRACT

The input and/or output device for process data exhibits a subrack (1) and at least one assembly (2) mounted on the subrack (1) and a process connector (4) which can be frictionally introduced into the at least one assembly at the front. The at least one assembly (2) exhibits a circuit board (17) arranged in a housing and a connector strip (18) which is frictionally connected to the process connector (4). This device is to be of simple and appropriate design and, at the same time, loading of the circuit board (17) with large mechanical forces is to be avoided. This is achieved by the fact that the connector strip (18) is mechanically rigidly connected to the housing and contains elastically deformable terminal pins (21) on which the circuit board (17) is supported.

6 Claims, 4 Drawing Sheets

I/O DEVICE INCLUDING CIRCUIT BOARD NON-RIGIDLY SUPPORTED BY ELASTICALLY DEFORMABLE TERMINAL PINS EXTENDING FROM A CONNECTOR STRIP

BACKGROUND OF THE INVENTION

1. Field of the Invention

The invention is based on an input and/or output device such input and/or output devices exhibit assemblies mounted on a subrack and connected via process connectors and cables to a device for executing a process, which communicate with one another via a system bus. The assemblies contain in each case at least one circuit board arranged in a housing and accept signals from signal transmitters of the process execution device, process the signals, if necessary by taking into consideration signals which are emitted by other assemblies, and/or supply signals to signal receivers of the process execution device. Depending on requirement, an assembly can fulfill input, output, input and output and/or processing functions.

2. Discussion of Background

An input and/or output device is known, for example, from EP-A-165434. In this device, the process connectors are in each case provided with a pivoting hinge which is adapted to a connector strip which is mechanically and electrically permanently connected to the circuit board. Thus transverse forces caused by operation, wiring and/or vibrations and acting on the process connectors arranged at the front are transferred from each process connector via the connector strip to the circuit board permanently Joined to it which, in turn, delivers the forces via the housing to a subrack fixing the assembly.

SUMMARY OF THE INVENTION

The invention achieves the object of creating an input and/or output device of the type initially mentioned, which is of simple and appropriate design and in which the circuit board is almost completely spared great mechanical stresses.

The input and/or output device according to the invention is distinguished by the fact that the forces introduced into the assemblies by the process connectors are almost completely transferred to the subrack by mechanically adapted components such as connector strip and housing. As a result, the circuit boards are mechanically relieved and can solve elaborate electrical tasks without interference.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
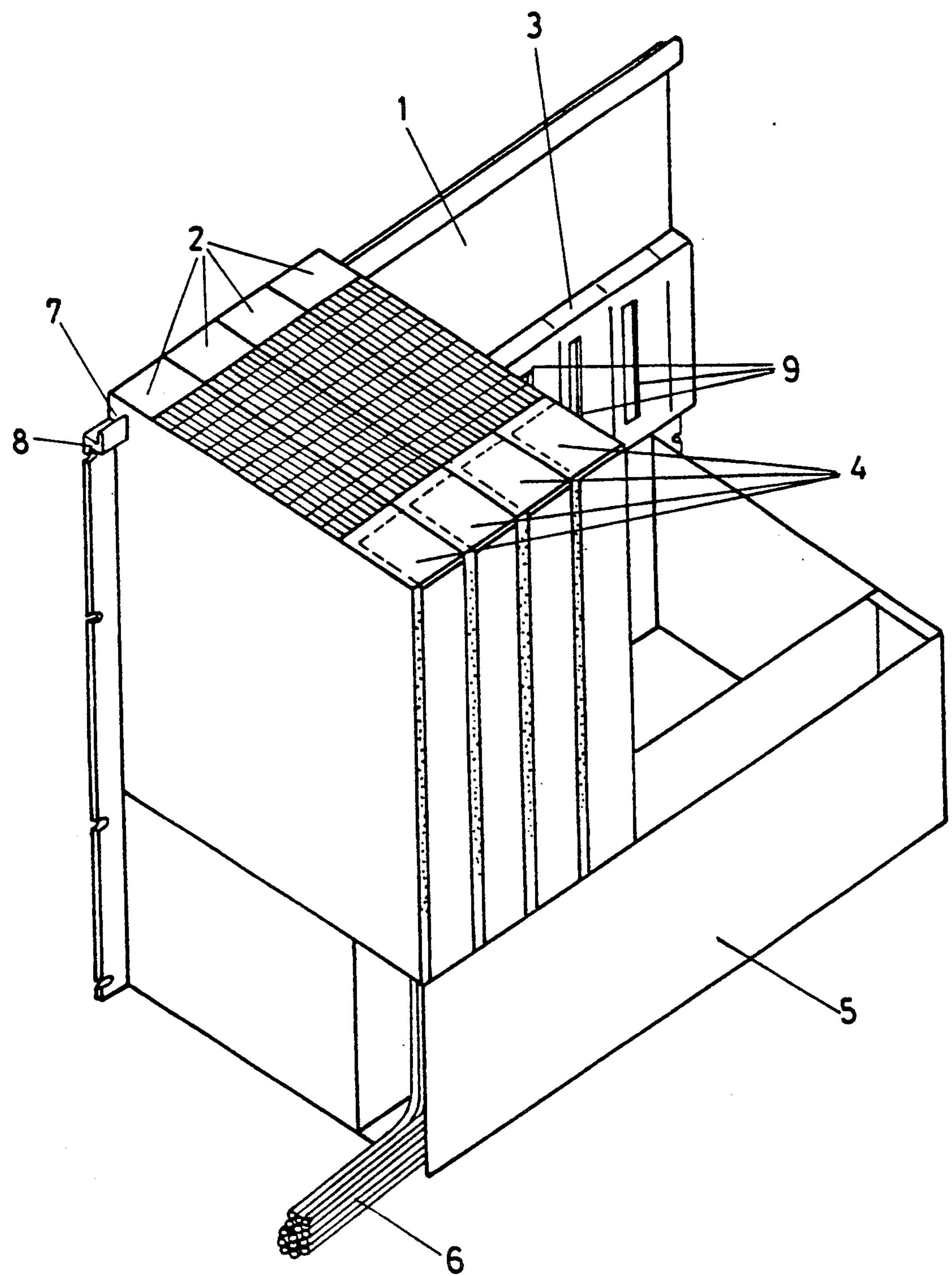
FIG. 1 shows a perspective view of a simplified representation of an embodiment of the input and/or output device according to the invention.

Referring now to the drawings, wherein like reference numerals designate identical or corresponding parts throughout the several views, the input and/or output device shown in Figure I consists of essentially box-shaped assemblies 2 mounted adjacently to one another on a subrack 1, of which assemblies only those constructed in identical manner are shown for reasons of simplicity, the subrack 1 with a bus holder 3 and process connectors 4. The process connectors 4 can be decoupled from the assemblies 2 and are connected via cables 6 run in a duct 5 to signal sources and signal receivers, not shown, of a device, also not shown, for executing a process, for example a production or a machining process. At the rear of the assemblies 2, there is in each case a mounting claw 7 in the upper part and a bus connector, which cannot be seen in FIG. 1. The mounting claw 7 engages a holder 8 attached to the subrack 1. During assembly, each assembly 2 is inserted with its mounting claw 7 into the profiled rail 8, pivoted with its rear against the subrack 1 and subsequently completely fixed by a screw fitting, which cannot be seen. During the pivoting, the bus connector and a bus coupling 9 provided on the bus holder 3 form a plug-in connection via which signals are conducted into the bus carried by the bus holder 3 and thus to other assemblies 2 and/or can be taken from the bus holder 3 and thus from other assemblies 2.

Figure 2:
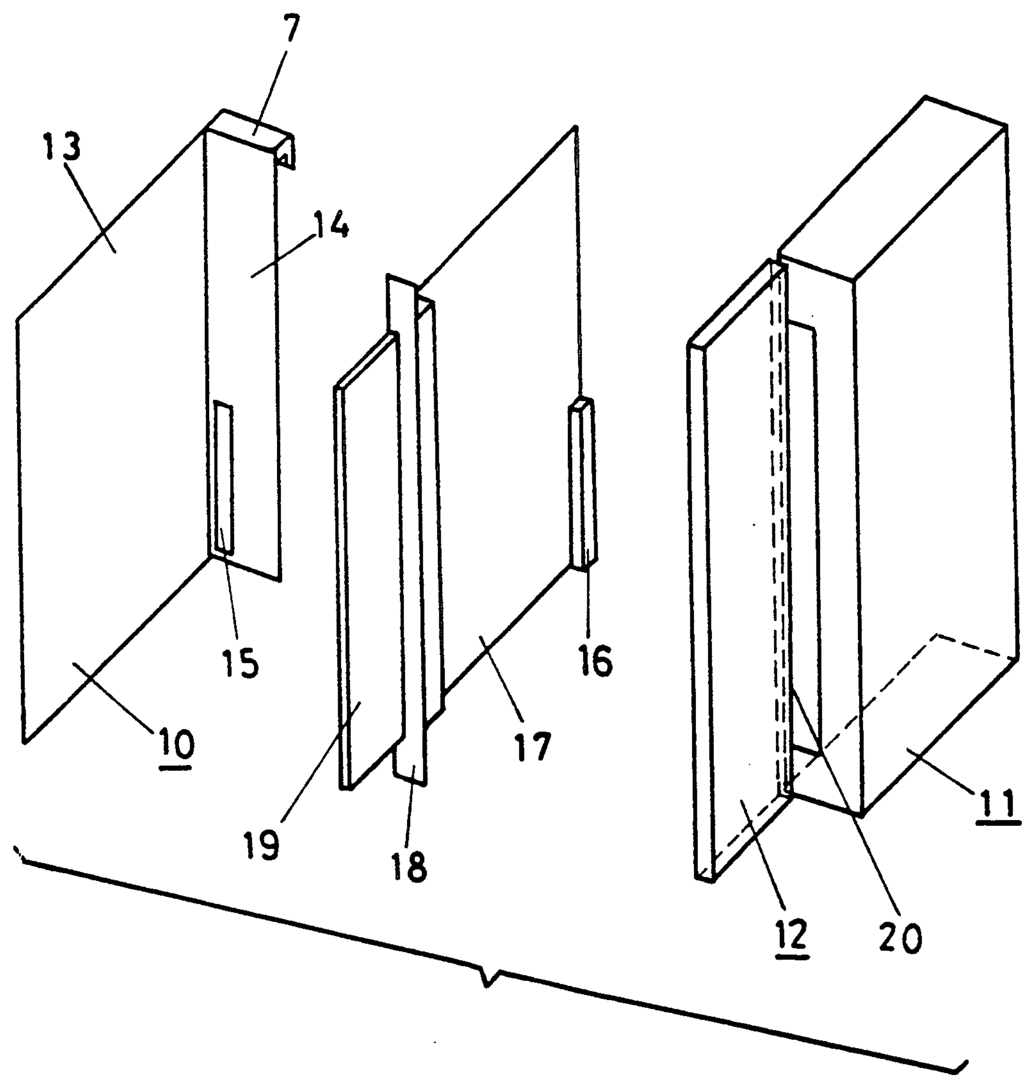
FIG. 2 shows a perspective view of the essential components of an assembly of the input and/or output device according to FIG. 1.

Each assembly contains a housing formed from a support part 10 and covers 11, 12 according to FIG. 2. The support part 10 is essentially formed by two plates arranged in an L-shape with respect to one another, one of which is used as side wall 13 and the other one of which is used as red=wall 14 of the housing of the assembly 2. In the rear wall 14, carrying in the upper part the mounting claw but possibly also containing openings for attaching the mounting claw, an opening 15 is provided which is used for passing through a bus connector 16. The bus connector 16 can be supported on the support part 10 and exhibits terminal pans which are in contact with conductor tracks, not shown, of a circuit board 17 and are also not shown. The circuit board 17 is connected to a connector strip 18, which can be supported on the support part 10, with terminal pins which act in conjunction with terminal sockets of the process connector 4, and to at least one circuit board 19 carrying indicating diodes, not shown. When the assembly 2 is assembled, the connector strip 18 is fixed on the support part 10 and the circuit boards 17 and 19 connected thereto are enclosed in the housing formed during this process by snapping on the covers 11 and. 12. An opening 20 provided in the cover 11 is used for passing through the connector strip 18.

Figure 3:
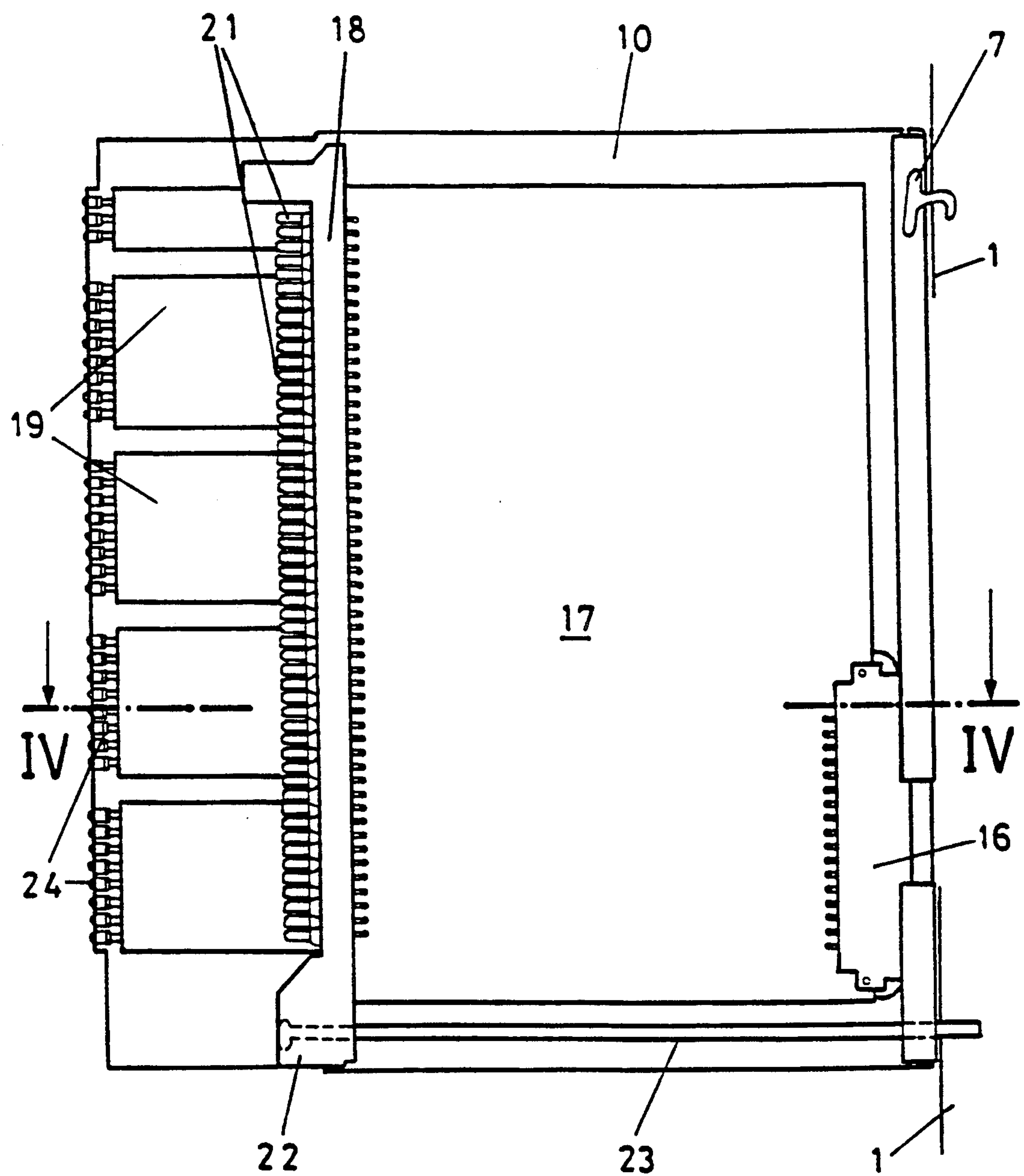
FIG. 3 shows a side view of an assembly of the input and/or output device according to FIG. 1, in which parts of the assembly housing have been removed.
Figure 4:
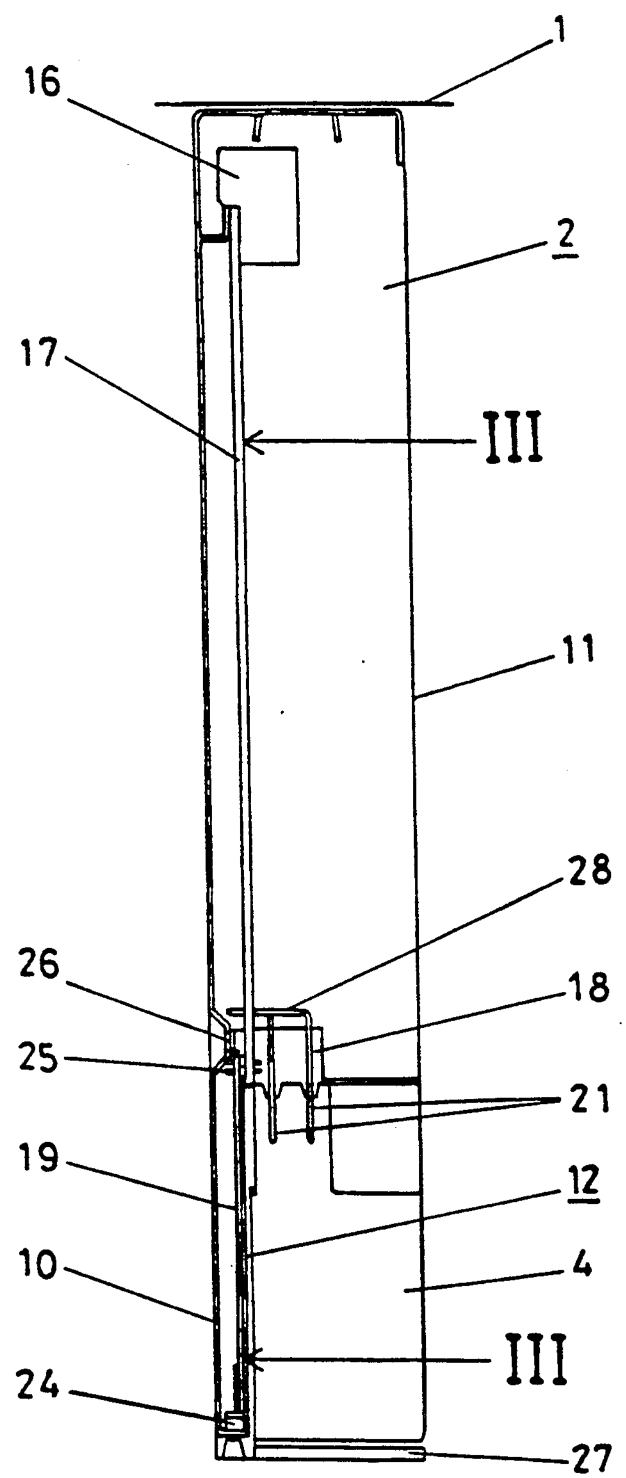
FIG. 4 shows a top view of a section along IV—IV through an assembly according to FIG. 3.

FIGS. 3 and 4 show the more detailed construction of an assembly 2. Thus, it can be seen from FIG. 3 (side view after removal of the covers 11, 12) that the connector strip 18 carries terminal pins 21 and a support element 22 which is possibly also provided at the support part 10, and a clamping screw 23 and that furthermore several circuit boards 19 with indicating diodes 24 are provided. From FIG. 4 (top view of a section along IV—IV through the assembly 2, the covers 11 and 12 being inserted and the process connector 4 being pivoted into the assembly 2 in contrast to FIG. 3) it can be seen that the circuit board 17 is electrically and mechanically connected to the circuit boards 19 via contact parts 25, that the connector strip 18 is mechanically permanently joined to the support part 10 of the housing of the assembly 2 by means of screws 26 and that the pivoted-in process connector 4 is covered by a door 27 which is pivotably attached to the cover 12 snapped in on the support part 10. It can also be seen that the terminal pins 21 contain elastically deformable terminal parts 28 of curved construction on which the circuit board 17 is preferably supported by means of a pressing-in technique.

The input and/or output device according to the invention acts as follows: for putting it into operation, after the assembly 2 has been pivoted in and fixed to the subrack i by means of mounting claw 7 and clamping screw 23, the process connector 4 is first placed with one support element on the support element 22 of the connector strip 18 and guided into the position shown in FIG. 4 by means of a rotary movement taking place in the plane of the drawing according to FIG. 3. During this process, sockets of the process connector 4, which are not shown and are electrically conductively connected to the cables 6, come into contact with the terminal pins 21 and thus establish an effective electrical connection between the signal transmitters and/or signal receivers of the device for executing the process and the bus or other assemblies 2 via the circuit tracks and possibly provided components of the circuit board 17.

Since mechanical forces are also possibly transferred by the cable 6, the pivoted-in process connector 4 is protected against unwanted movement, for example by means of a screw fitting covered by the door 27 and acting on the connector strip 18. The mechanical forces produced by the cable 6 are transferred via the process connector 4, the connector strip 18 and the support part 10 to the subrack 1. This is due to the fact that the process connector 4 is frictionally connected to the connector strip 18 by means of the pivoting hinge formed by its support element and the support element 22 and by means of the screw connection and that correspondingly the connector strip 18 rests frictionally on the support part 10 by means of the screws 26 and is coupled via this, the mounting claw 7 and the clamping screw 23 mechanically rigidly to the subrack 1.

The circuit board 17 remains almost free of unwanted mechanical forces. This is due to the fact that the circuit board 17 is only held via elastically deformable terminal pins 21, at least in the area of the connector strip 18. Mechanical forces conducted from the process connector 4 into the assembly 2 thus scarcely influence the circuit board 17 especially at the point where the greatest mechanical stress would occur as a result of the introduction of force.

If terminal pins which act in conjunction with sockets of the bus coupling 9 (FIG. 1) and which are constructed in accordance with the connector strip area and are fitted into the circuit board 17 are provided in the bus connector 16, the circuit board 17 is not anywhere frictionally connected to the force transferring parts such as process connector 4, connector strip 18, support part 10 and subrack 1 and is now protected against damage in a particularly advantageous manner.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An input and/or output device for process data comprising a subrack (1), at least assembly(2) mounted on the subrack (1) and a process connector (4)having a construction that enables the process connector to be introduced into the at least one assembly (2), in which the at least one assembly (2) includes at least one circuit board (17) arranged in a housing and electrically conductively connected to the process connector (4) and to a bus connector (16), and a connector strip (18) frictionally connected to the process connector (4), wherein the connector strip (18) is mechanically rigidly connected to the housing and contains elastically deformable terminal pins (21) on which the circuit board (17) is non-rigidly supported.

2. The input and/or output device are claimed in claim 1, wherein the bus connector (16) is mechanically rigidly connected to the housing and contains elastically deformable terminal pins on which the circuit board (17) is non-rigidly supported.

3. The input and output device as claimed in claim 2, wherein the housing contains a support part detachably attached to the subrack and a cover supported on the support part.

4. The input and output device as claimed in claim 1, wherein the housing contains a support part (10) detachably attached to the subrack (1) and a cover (11, 12) supported on the support part (10).

5. The input and/or output device as claimed in claim 4, wherein the connector strip (18) and the bus connector (16) are mounted on the support part (10).

6. The input and/or output device as claimed in claim 4, wherein a support element (22) in which a support element mounted on the process connector (4) is mounted on the support part (10) or on the connector strip (18).

* * * * *